(12) United States Patent
Hofmann et al.

(10) Patent No.: US 7,250,767 B2
(45) Date of Patent: Jul. 31, 2007

(54) METHOD FOR INTRODUCING A LIQUID SAMPLE INTO AN NMR SPECTROMETER

(75) Inventors: Martin Hofmann, Rheinstetten (DE); Pius Fink, Hombrechtikon (CH)

(73) Assignee: Bruker Biospin GmbH, Rheinstetten (DE)

( * ) Notice: Subject to any disclaimer, the term of this patent is extended or adjusted under 35 U.S.C. 154(b) by 19 days.

(21) Appl. No.: 11/144,779

(22) Filed: Jun. 6, 2005

(65) Prior Publication Data

US 2005/0280416 A1    Dec. 22, 2005

(30) Foreign Application Priority Data

Jun. 18, 2004    (DE)    ............. 10 2004 029 632

(51) Int. Cl.
*G01V 3/00*    (2006.01)
(52) U.S. Cl. ................................. 324/321
(58) Field of Classification Search ............ 324/307, 324/309, 318, 321
See application file for complete search history.

(56) References Cited

U.S. PATENT DOCUMENTS

| | | | | |
|---|---|---|---|---|
| 2,955,252 | A * | 10/1960 | Williams | ............ 324/307 |
| 4,259,291 | A | 3/1981 | Smythe | |
| 5,397,989 | A * | 3/1995 | Spraul et al. | ............ 324/321 |
| 6,380,737 | B1 * | 4/2002 | Myles | ............ 324/306 |
| 2004/0066193 | A1 * | 4/2004 | Ardenkjaer-Larsen et al. | ............ 324/309 |
| 2004/0259269 | A1 * | 12/2004 | Lin et al. | ............ 436/516 |

FOREIGN PATENT DOCUMENTS

EP    0 109 198    5/1984

* cited by examiner

*Primary Examiner*—Brij Shrivastav
*Assistant Examiner*—Dixomara Vargas
(74) *Attorney, Agent, or Firm*—Paul Vincent

(57) ABSTRACT

A method for introducing a liquid sample into an NMR spectrometer to measure an NMR spectrum of the liquid sample, wherein the liquid sample is injected into a supply line and wherein further liquids are supplied into the supply line following the liquid sample, which are separated from each other and from the liquid sample by gas bubbles is characterized in that the liquid sample is supplied via an injection inlet to a valve configuration whose output side can be connected to the supply line and the further liquids and gas are supplied to the valve configuration via supply lines, wherein a desired sequence of sample segments, gas bubbles and further liquid segments is generated through temporally matched switching of the valve configuration in the supply line and is supplied to the NMR spectrometer. The inventive method realizes supply of a liquid sample into an NMR spectrometer with rapid sample transfer while thereby preventing mixing and dilution of the individual segments.

13 Claims, 2 Drawing Sheets

METHOD FOR INTRODUCING A LIQUID SAMPLE INTO AN NMR SPECTROMETER

This application claims Paris Convention priority of DE 10 2004 029 632.4 filed Jun. 18, 2004 the entire disclosure of which is hereby incorporated by reference.

BACKGROUND OF THE INVENTION

The invention concerns a method for introducing a liquid sample into an NMR spectrometer to measure an NMR spectrum of the liquid sample, wherein the liquid sample is injected into a supply line and further liquids are subsequently supplied into the supply line that are separated from each other and from the liquid sample by gas bubbles.

A method of this type is disclosed in U.S. Pat. No. 5,397,989 A. In this conventional method, gas bubbles are generated between a sample liquid and a transport liquid in a sample loop to spatially separate the two liquids and prevent mixing thereof. The sample liquid and separating segments (gas and liquid segments) are sequentially drawn up into the sample loop using a needle. The sample loop is then connected to the NMR using a connecting capillary and can be pumped into the NMR spectrometer through that capillary. It is also possible to use an internal "parking" capillary which can be connected to the NMR using a valve, thereby also forming segments consisting of sample, gas and liquid segments, which are intermediately "parked" before being pumped towards the NMR spectrometer.

This method is disadvantageous in that the sample is held in a "parked" position until all gas and/or liquid segments have been drawn up into the sample loop. Only then are the sample with separating segments supplied to the NMR spectrometer. This method wastes substantial amounts of time which can deteriorate the measuring result, in particular, for instable samples. A further, much more serious problem is the so-called "back mixing" or "carry over". Since only one needle is used for all operations, i.e. for drawing up the sample and also for drawing up the different liquid segments, the liquids in the storage containers may be contaminated and mixed within the capillaries. Such contamination can be prevented only through complex cleaning between the individual steps. This is possible only to a limited degree due to the danger that the cleaning agent diffuses into the needle and mixes with the drawn-up liquids.

It is the object of the invention to propose a method for supplying a liquid sample into an NMR spectrometer, which permits rapid sample transfer and prevents mixing and dilution of the individual segments.

SUMMARY OF THE INVENTION

This object is achieved in accordance with the invention in that the liquid sample is supplied via an injection inlet of a valve configuration whose outlet side can be connected to the supply line, wherein the further liquids and gas are supplied via supply lines of the valve configuration and, through temporally matched switching of the valve configuration, a desired sequence of sample segments, gas bubbles and further liquid segments is generated in the supply line for supply to the NMR spectrometer.

The inventive method provides separate lines and connections for each liquid (e.g. solvent), the sample segments and the gas, which terminate in a valve configuration. This prevents mixing of the different components in the storage containers and also within the capillary. The desired liquid and gas segments can moreover be easily generated in the capillary using the inventive valve configuration.

In a preferred variant of the inventive method, the generated sequence is supplied directly to the NMR spectrometer, without intermediate storage. The individual liquid and gas segments required for transfer to the NMR spectrometer are not intermediately parked in a delay loop in the inventive method, but are combined "on the fly" in the transfer capillary leading to the NMR spectrometer. This reduces the distance to the NMR spectrometer such that, after combination, only little volume is required to position the sample in the FI probe head. This technique saves approximately 50% of the preparation time. In terms of seconds, the time saved thereby amounts to between approximately 20 and 40 seconds, depending on the application. With a cycle time of 1.5 to 2 minutes, this gain is exceedingly high.

In a particularly advantageous manner, the sequence is monitored and optionally controlled in the supply line after exiting the valve configuration. The positions and delivery amounts of the individual segments are synchronized to accelerate combination of the entire desired sample train including sample, gas and liquid segments.

In a further advantageous variant of the inventive method, backwashing of the supply line opposite to the supply direction is carried out after measurement using a rinsing gas and/or at least one rinsing liquid. Contamination of a subsequent sample through transfer of the already measured sample is thereby prevented.

In a further development of the method, backwashing is effected via a further valve configuration whose output side can be connected to the supply line, wherein the rinsing gas and/or the rinsing liquid(s) are supplied via supply lines of the additional valve configuration. The additional valve configuration ensures simple and easy-to-control supply of the rinsing liquid(s) and/or rinsing gas.

In an advantageous further development of the inventive method, a desired sequence of rinsing gas bubbles and rinsing liquid segments for backwashing is generated in the supply line through temporally matched switching of the additional valve configuration. A suitable, e.g. pulsed sequence of rinsing gas bubbles and rinsing liquid segments can realize more efficient cleaning compared to conventional cleaning using a continuous liquid flow.

In an advantageous variant of the method, the supply line is heated for bringing the samples to a desired temperature during transport to the NMR spectrometer, the temperature permitting control of the viscosity of the sample and creation of reproducible, stable conditions. Moreover, a possible heating process in the NMR spectrometer is accelerated through pre-heating of the sample in the supply line which saves additional time.

The present invention also concerns a device for carrying out the described method, having a supply line for supplying the liquid sample into the NMR spectrometer, wherein the device comprises a valve configuration which can be connected to the supply line at an output side thereof and having the injection inlet and injection outlets for gas and additional liquids. The separate supply line inlets for gas and further liquids which can be combined in the valve configuration prevent undesired mixing or contamination of the liquids such that the inventive method can be carried out with this device.

In an advantageous embodiment of the inventive device, the supply line is provided with a sensor for measuring the gas volume of the gas bubbles and/or the liquid volume of the liquid segments to permit precise control of the amount of supplied liquid or supplied gas.

In a further development of this embodiment, the sensor is an optical sensor.

A particularly advantageous further development of the device comprises an electronic control means which is connected to the sensor and the valve configuration for exact control of the gas volume of the gas bubbles or the liquid volumes of the liquid segments. A control means of this type permits combination of any sequence with gas segments, liquid segments and sample.

A particularly advantageous embodiment of the inventive device comprises a further valve configuration whose output side can be connected to the supply line, having supply inlets for the rinsing gas and/or rinsing liquid and a discharge outlet. The additional valve configuration permits cleaning of the supply lines with rinsing gas and/or rinsing liquid to prevent transfer of the sample substance to the next sample.

Further advantages of the invention can be extracted from the description and the drawing. The features mentioned above and below can be used individually or collectively in arbitrary combination. The embodiment shown and described is not to be understood as exhaustive enumeration but has exemplary character for describing the invention.

The invention is shown in the drawing and is explained in more detail with reference to an embodiment.

DESCRIPTION OF THE PREFERRED EMBODIMENT

Figure 1:
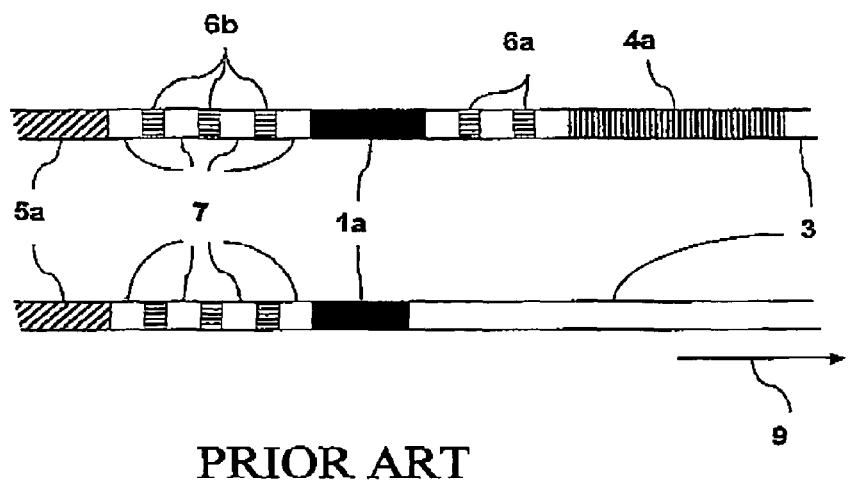
FIG. 1 shows capillaries filled with sample, gas and liquid segments.

A capillary 3 is used to transfer a sample substance 1 into an NMR spectrometer 2 using a flow method, and can receive, in addition to a sample segment 1a with the sample substance 1, further liquid segments 4a, 5a, 6a, 6b and gas bubbles 7 (FIG. 1). The cleaning liquid 4 introduced into the capillary as cleaning segment 4a acts like a brush due to adhesion between the cleaning segment 4a and the wall of the capillary 3 and cleans the capillary 3 to prevent transfer of the sample previously transported through the capillary 3 to the next sample. The sample segment 1a is transported via a drive liquid segment 5a which is transported in the supply direction 9 using a pump 8. To prevent mixing of the sample substance 1 and the cleaning or drive liquid 4, 5, gas bubbles 7 and separating segments 6a, 6b are alternately drawn up between the sample segment 1a and the cleaning segment 4a and the sample segment 1a of the drive liquid segment 5a, respectively. If the capillary 3 has been already cleaned, the cleaning segment 4a and the separating segments 6a can be omitted, as is shown in the lower part of FIG. 1.

Figure 2:
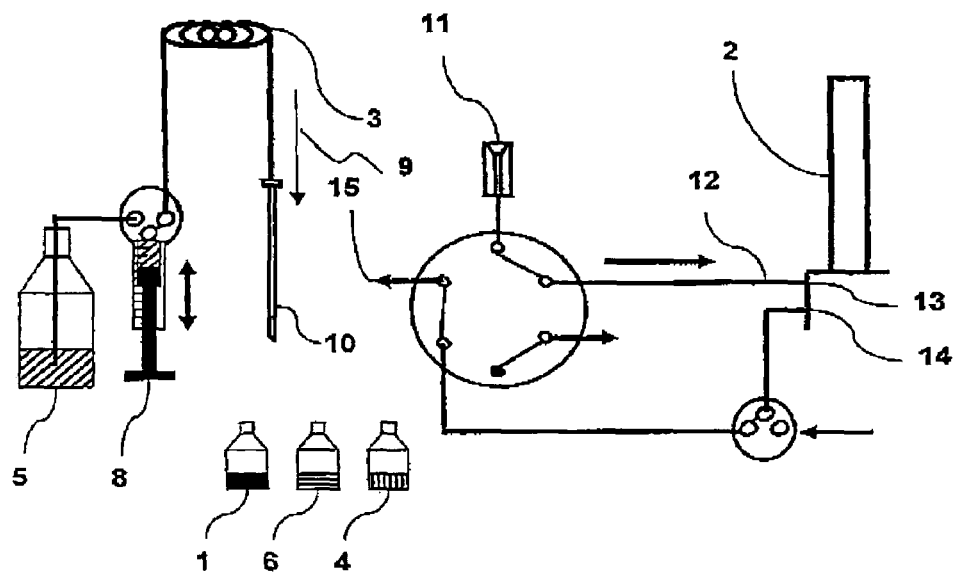
FIG. 2 shows a device for supplying a liquid sample into an NMR spectrometer according to prior art.

FIG. 2 shows a device for supplying a liquid sample to an NMR spectrometer 2 according to prior art. The sample substance 1 and the cleaning liquid 4 and the liquid 6 for the separating segments 6a, 6b are sequentially drawn up into the capillaries 3 in the desired order using a needle 10. Since the liquids 1, 4, 6 are drawn up using only one needle 10, the various liquids 1, 4, 6 may inadvertently be mixed within the capillary 3. During drawing up of the individual substances, the previously drawn-up substances are "parked" in the capillary 3 until the desired sequence of liquid and gas segments 1a, 4a, 5a, 6a, 6b, 7 is disposed in the capillary 3. The capillary 3 is subsequently connected via an injection inlet 11 to a supply line 12 through which the liquid and gas segments 1a, 4a, 5a, 6a, 6b, 7 are transferred to the inlet 13 of the NMR spectrometer 2. The drive liquid 5 thereby provides defined transport of the liquid and gas segments 1a, 4a, 5a, 6a, 6b. After measurement, the liquid and gas segments 1a, 4a, 5a, 6a, 6b, 7 are supplied to a discharge outlet 15 via an outlet 14 of the NMR spectrometer 2.

Figure 3:
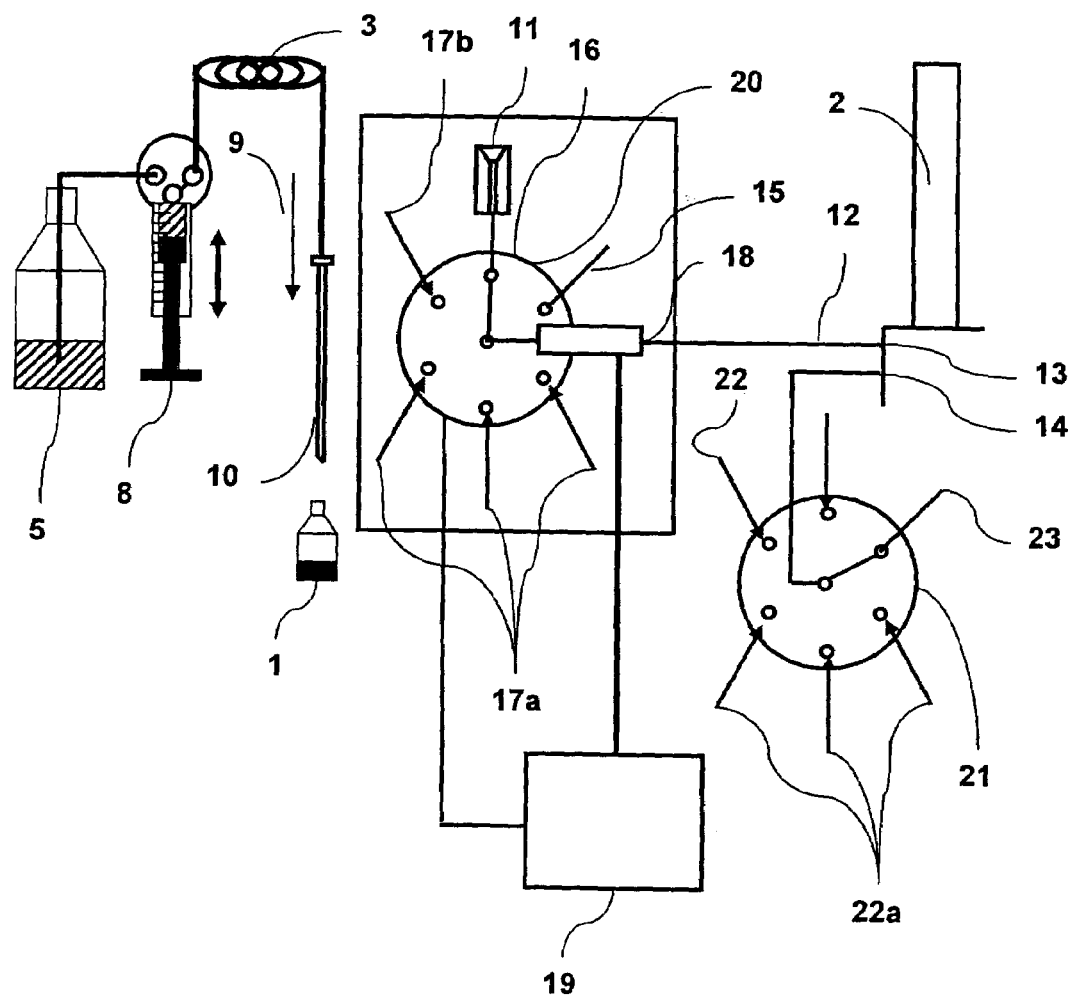
FIG. 3 shows an embodiment of the inventive device for supplying a liquid sample into an NMR spectrometer.

FIG. 3 shows a device for supplying a liquid sample into an NMR spectrometer 2 in accordance with the present invention, wherein the liquid and gas segments 4a, 5a, 6a, 6b, 7 are formed by a valve configuration 16. The device comprises at least one independent needle 10 for receiving and discharging the sample substance 1, which can be connected to the rapidly rotating valve configuration 16 via the injection inlet 11. The sample substance 1 is transferred from the valve configuration 16 to the NMR spectrometer 2 via the supply line 12. In addition to the sample substance 1, the liquids 4, 5, 6 and/or gases 7 which are required for the sample transport are supplied to the supply line 12 via separate supply lines 17a of the valve configuration 16. Further needles (not shown) may be directly docked into the valve configuration 16, and each be directly connected to the corresponding liquids. The valve configuration 16 also comprises a gas connection 17b and a discharge outlet 15 in addition to the supply lines 17a. If the needles are docked into the valve configuration 16, the position and discharged amount are synchronized to permit combination of the entire sample train, including gas and liquid segments 4a, 5a, 6a, 6b, 7 and sample segment 1a, with maximum speed. After termination of the measurement, the sample substance can be returned via the supply line 12 or can be discharged via a discharge outlet 23 of a further valve configuration 21, described below.

In contrast to the conventional device (FIG. 2), the needle 10 of the inventive device only comes in contact with the sample substance 1 and not with any other liquid during sample transfer. Each liquid, the sample segments and the gas have their separate lines and inlets thereby preventing "backmixing". The valve configuration 16 has a small volume 20 through which all liquids 1, 4, 5, 6, and gases 7 are guided before forming segments such that mixing of the individual substances would, in principle, be possible. However, the liquids 1, 4, 5, 6, and gases 7 all move through the volume 20 in the same direction such that mixing of the individual components is nearly impossible. A structure comprising several needles and injection inlets could also be used to provide automatic solvent change.

To prevent transfer of a given sample substance 1 into the next sample, the needle 10 may be cleaned after each operation without diluting and/or mixing the liquid segments. The above-mentioned further valve configuration 21 of the inventive device is provided to clean the supply line 12. The valve configuration 21 can be connected to the supply line 12 and comprises feed inlets 22a for rinsing liquids, an inlet 22b for a rinsing gas and the discharge outlet 23 for discharging the examined sample substance 1 and the liquids and/or gases transported in the capillary together with the sample substance. The rinsing gas and/or the rinsing liquids are guided through the outlet 14 of the NMR spectrometer 2 through the capillary 3 opposite to the supply direction and are discharged via the outlet 15 of the valve configuration 16. A rinsing sequence of different rinsing liquids and gases can be obtained in a simple and rapid manner using the additional valve configuration 21 thereby realizing more effective cleaning of the supply line 12.

Since, in contrast to prior art, the sample segment 1 including liquid and gas segments 4a, 5a, 6a, 7b, 7 is not parked but directly formed along the path after combination, only little volume is required to dispose the sample segment 1a in the FI probe head of the NMR spectrometer 2. The device in accordance with the present invention not only prevents or minimizes contamination of the liquid but also reduces the transfer time.

One problem of this technology is the apportioning of the gas. This process cannot be exclusively controlled by fixed cycling only, due to variable input pressure, gas compression and varying backpressure conditions in the system. To exactly determine the required gas volume, sensors 18 are provided in the supply line 17b of the gas towards the NMR spectrometer 2 for controlling the apportioning of the gas. The rapidly rotating valve configuration 16 is rotated from the gas position to the subsequent position to supply the desired liquid as soon as the sensor 18 has calculated the adjusted volume. The gas volumes can thereby be calculated via a calibrated volume between two sensors 18. Larger volumes are multiplied by a time factor. To more precisely determine the final position in the NMR spectrometer 2, an identical sensor 18 may be provided in the probe head of the NMR spectrometer 2. An electronic control means 19 may additionally be provided to control and regulate the gas supply according to the values measured by the sensor 18.

The present invention provides a method and a device for supplying a liquid sample into an NMR spectrometer with rapid sample transfer, wherein mixing and dilution of the individual segments is prevented.

LIST OF REFERENCE NUMERALS 1 sample substance
1a sample segment
2 NMR spectrometer
3 capillary
4a cleaning segments
4 cleaning liquid
5a drive liquid segment
5 drive liquid
6 liquid for separating segments
6a separating segment
6b separating segment
7 gas bubbles
8 pump
9 supply direction
10 needle
11 injection inlet
12 supply line
13 inlet to the NMR spectrometer
14 outlet of the NMR spectrometer
15 discharge outlet
16 valve configuration
17a supply line for further liquids
17b supply line for gas
18 sensor
19 electronic control means
20 volume
21 further valve configuration
22a supply inlets for rinsing liquids
22b supply inlet for rinsing gas
23 discharge outlet

We claim:

1. A method for supplying a liquid sample to a measuring position of an NMR spectrometer for measuring an NMR spectrum of the liquid sample, the method comprising the steps of:
a) introducing the liquid sample to a first controlled inlet of a valve member, the valve member having a plurality of controlled inlets and an outlet in communication with a supply line leading to the measuring position of the NMR spectrometer;
b) introducing a further liquid to a second controlled inlet of the valve member;
c) introducing gas to a third controlled inlet of the valve member; and
d) controlling the first, second, and third inlets to produce a desired sequence of liquid sample, further liquid, and gas in the supply line.

2. The method of claim 1, wherein the desired sequence is supplied directly to the NMR spectrometer, without intermediate storage.

3. The method of claim 1, wherein the sequence is monitored during or after transfer from the valve member to the supply line.

4. The method of claim 3, wherein the sequence is controlled.

5. The method of claim 1, wherein a measuring procedure is followed by backwashing of the supply line opposite to a supply direction using a rinsing gas and/or at least one rinsing liquid.

6. The method of claim 5, wherein backwashing is performed via a further valve member whose output side can be connected to the supply line, wherein the rinsing gas and/or the rinsing liquid are supplied to the further valve member via further supply lines.

7. The method of claim 6, wherein, for backwashing, a desired sequence of rinsing gas bubbles and rinsing liquid segments is generated in the supply line through temporally matched switching of the further valve member.

8. The method of claim 1, wherein the supply line is heated.

9. A device for supplying a liquid sample to a measuring position of an NMR spectrometer for measuring an NMR spectrum of the liquid sample, the device comprising:
means for introducing the liquid sample to a first controlled inlet of a valve member, said valve member having a plurality of controlled inlets and an outlet in communication with a supply line leading to the measuring position of the NMR spectrometer;
means for introducing a further liquid to a second controlled inlet of said valve member;
means for introducing gas to a third controlled inlet of said valve member; and
means for controlling said first, second, and third inlets to produce a desired sequence of liquid sample, further liquid, and gas in said supply line.

10. The device of claim 9, wherein said supply line comprises a sensor for measuring a gas volume of gas bubbles and/or a liquid volume of liquid segments.

11. The device of claim 10, wherein said sensor is an optical sensor.

12. The device of claim 10, wherein the device comprises an electronic control means which is connected to said sensor and said valve member for exact control of the gas volume of the gas bubbles and/or the liquid volume of the liquid segments.

13. The device of claim 9, wherein the device further comprises an additional valve member whose output side can be connected to said supply line, said additional valve member having supply inlets for a rinsing gas and/or a rinsing liquid, said additional valve member also having a discharge outlet.

* * * * *